United States Patent
Hong et al.

(10) Patent No.: US 7,227,807 B2
(45) Date of Patent: Jun. 5, 2007

(54) METHOD OF CONFIGURING MEMORY CELL ARRAY BLOCK, METHOD OF ADDRESSING THE SAME, SEMICONDUCTOR MEMORY DEVICE AND MEMORY CELL ARRAY BLOCK

(75) Inventors: Sang-Pyo Hong, Seoul (KR); Du-Yeul Kim, Suwon-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 11/302,606

(22) Filed: Dec. 14, 2005

(65) Prior Publication Data
US 2006/0126419 A1  Jun. 15, 2006

(30) Foreign Application Priority Data
Dec. 15, 2004  (KR) .................... 10-2004-0106414

(51) Int. Cl.
*G11C 8/00* (2006.01)
(52) U.S. Cl. ................. 365/230.06; 365/185.11
(58) Field of Classification Search ......... 365/185.11, 365/230.03
See application file for complete search history.

(56) References Cited

U.S. PATENT DOCUMENTS

| 5,572,466 | A | * | 11/1996 | Sukegawa | ............... | 365/185.33 |
| 6,212,121 | B1 | | 4/2001 | Ryu et al. | ............... | 365/230.03 |
| 6,567,307 | B1 | * | 5/2003 | Estakhri | ................ | 365/185.11 |
| 6,590,822 | B2 | * | 7/2003 | Hwang et al. | .............. | 365/222 |

FOREIGN PATENT DOCUMENTS

| JP | 2002-064142 | 2/2002 |
| KR | 10-2003-0055467 | 7/2003 |

* cited by examiner

*Primary Examiner*—Hoai V. Ho
(74) *Attorney, Agent, or Firm*—Mills & Onello, LLP

(57) ABSTRACT

A method of configuring a memory cell array block includes dividing a first unit logic block into sub-array blocks and assigning a portion of the sub-array blocks to a second unit logic block, wherein the memory cell array block corresponds to the portion of the sub-array blocks and the second unit logic block, and the portion of the sub-array blocks and the second unit logic block share a peripheral circuit. The first unit logic block may be divided into the sub-array blocks based on a unit of a word line and/or a unit of a bit line. The peripheral circuit may include a row decoder, a column decoder, a sense amplifier and/or an equalize/precharge circuit. A related addressing method, a memory cell array block and semiconductor memory device are also provided.

19 Claims, 10 Drawing Sheets

METHOD OF CONFIGURING MEMORY CELL ARRAY BLOCK, METHOD OF ADDRESSING THE SAME, SEMICONDUCTOR MEMORY DEVICE AND MEMORY CELL ARRAY BLOCK

CLAIM FOR PRIORITY

This application claims priority under 35 USC § 119 to Korean Patent Application No. 10-2004-0106414, filed on Dec. 15, 2004, the contents of which are herein incorporated by reference in their entirety for all purposes.

BACKGROUND OF THE INVENTION

1. Field of the Invention

The present invention relates to a semiconductor memory device, and more particularly to a method of configuring a memory cell array block of a semiconductor memory device, and a method of addressing the memory cell array block.

2. Description of the Related Art

As semiconductor memory devices have increased capacity, memory cell arrays of the semiconductor memory devices have increased accordingly. Therefore, it is very important to divide memory cell arrays into memory cell array blocks of an appropriate size.

When the size of the memory cell array is increased along a word line, a resistance-capacitance (RC) delay may be increased and an area of a decoder may also be increased because an output stage of the decoder for driving the word line needs to have an increased capacity. In addition, power consumption may be increased due to driving of the word line.

When the size of the memory cell array is increased along a bit line, capacitance of the bit line may be increased so that a voltage change of the bit line in a read operation is decreased due to charge sharing, causing difficulty in detecting data accurately. In addition, RC delay may be increased so that a speed of detecting data is decreased. Furthermore, as a length of the bit line is increased, power consumption of a sense amplifier is increased accordingly.

Therefore, to overcome the above-described problems, the memory cell array may be divided into memory cell array blocks of which word lines and bit lines have appropriate lengths, and each of the memory cell array blocks is coupled to an associated peripheral circuit such as a row decoder, a column decoder, a sense amplifier, etc.

However, when the memory cell array is divided into a plurality of memory cell array blocks, the number of required peripheral circuits such as the row decoder, the column decoder and the sense amplifier is increased, resulting in increased chip size. Therefore, the size of the memory cell array block needs to be appropriately determined so as to achieve the smallest possible chip size.

In a conventional memory cell array, the memory cell array block is assigned to a size of a block having a power-of-two number of memory cells. For example, in order to increase the size of a row block including $2^8$ word lines, the size of the row block may be increased to a row block including $2^9$ word lines. This is because there exists a limitation in the bit number of the address for selecting a word line so that the memory cell array block needs to have as many word lines as a corresponding bit number of the address. Similarly, in order to decrease the size of a row block including $2^9$ word lines, the row block can be decreased to a row block including $2^8$ word lines.

FIG. 1 is a block diagram illustrating row blocks of a conventional semiconductor memory device.

Referring to FIG. 1, each of the row blocks 110, 120, 130 and 140 of the conventional semiconductor memory device includes $2^K$ word lines.

FIGS. 2A and 2B are block diagrams illustrating a conventional method of configuring a memory cell array block.

Referring to FIG. 2A, the row blocks 110 and 120 of the row blocks 110, 120, 130 and 140 shown in FIG. 1 are merged into a row block 211, and the remaining row blocks 130 and 140 are merged into a row block 212. Each of the row blocks 211 and 212 is twice the size of each of the row blocks 110, 120, 130 and 140 in FIG. 1.

Referring to FIG. 2B, the row blocks 110, 120, 130 and 140 shown in FIG. 1 are divided into eight row blocks 221, 222, 223, 224, 225, 226, 227 and 228, each of which includes $2^{K-1}$ word lines. Each of the row blocks 221, 222, 223, 224, 225, 226, 227 and 228 is half the size of each of the row blocks 110, 120, 130 and 140 in FIG. 1.

As shown in FIGS. 1, 2A and 2B, in order to increase or decrease the size of the memory cell array block, the size of the memory cell array block is necessarily increased or decreased by a power of two according to the conventional art. However, as the memory cell array block includes a plurality of memory cells, adjusting the size of the memory cell array block by a unit of a power of two may not be sufficient to achieve a desired chip size or a desired transmission characteristic of a signal. That is, when the block size is decreased to one half, the chip size may be significantly increased although the transmission characteristic of the signal may be improved, and when the block size is increased to twice itself, the transmission characteristic of the signal may be greatly affected although the chip size may be decreased.

SUMMARY OF THE INVENTION

The present invention is provided to substantially obviate one or more problems due to limitations and disadvantages of the related art.

Example embodiments of the present invention provide a semiconductor memory device and a method for configuring a memory cell array block of a desired size.

Example embodiments of the present invention also provide a method of addressing a memory cell array block configured to have a desired size.

According to one aspect, the present invention is directed to a method of configuring a memory cell array block, in which a first unit logic block including first memory cells is divided into sub-array blocks; and at least a portion of the sub-array blocks are assigned to a second unit logic block including second memory cells. The memory cell array block includes the assigned portion of the sub-array block and the second unit logic block sharing a peripheral circuit.

The first and second unit logic blocks are logical blocks that are respectively addressed as a single block. The first and second unit logic blocks may have the same size corresponding to a power of two so that the first and second unit logic blocks are addressed by an address having a predetermined number of bits. The first unit logic block is addressed as a single block, but physically, the first unit logic block is divided into two or more sub-array blocks. The portion of the divided sub-array blocks are assigned to a second unit logic block.

The memory cell array may be divided based on a unit of a row (i.e., word line) or a unit of a column (i.e., bit line).

Furthermore, the peripheral circuit may include a row decoder for decoding a row address. The peripheral circuit may further include a column decoder for decoding a column address, a sense amplifier for amplifying a signal read from a memory cell and/or a bit line equalize/precharge circuit for precharging a bit line.

According to another aspect, the present invention is directed to a method of addressing a plurality of memory cell array blocks that respectively include at least a portion of a first unit logic block having $2^K$ (K is a natural number) word lines, and a second unit logic block unit having $2^K$ word lines, wherein the portion of the first unit logic block unit and the second unit logic block share a peripheral circuit in common. The method includes determining to which of the first unit logic block and the second unit logic block an addressed word line belongs based on a block select address; selecting a corresponding memory cell array block based on the block select address when the addressed word line belongs to the second unit logic block; and selecting a corresponding memory cell array block based on a next lower address of the block select address when the addressed word line belongs to the first unit logic block.

The block select address may correspond to, for example, upper bits of an address signal. The next lower address of the block select address may correspond to, for example, predetermined lower bits of the address signal.

According to another aspect, the present invention is directed to a method of addressing a plurality of memory cell array blocks that respectively include at least a portion of a first unit logic block having $2^K$ (K is a natural number) bit lines, and a second unit logic block having $2^K$ bit lines, wherein the portion of the first unit logic block and the second unit logic block share a peripheral circuit in common. The method includes determining to which of the first unit logic block and the second unit logic block an addressed bit line belongs based on a block select address; selecting a corresponding memory cell array block based on the block select address when the addressed bit line belongs to the second unit logic block; and selecting a corresponding memory cell array block based on a next lower address of the block select address when the addressed bit line belongs to the part of the first unit logic block.

According to another aspect, the present invention is directed to a semiconductor memory device, which includes memory cell array blocks; and peripheral circuits respectively corresponding to the memory cell array blocks, wherein each of the memory cell array blocks includes at least one combined memory cell array block. The combined memory cell array block includes first memory cells addressed as a first unit logic block, the first memory cells corresponding to at least a portion of $2^K$ (K is a natural number) memory cells of the first unit logic block; and second memory cells addressed as a second unit logic block, the second memory cells corresponding to $2^K$ memory cells of the second unit logic block.

In one embodiment, the first and second unit logic blocks include $2^L$ word lines and $2^M$ bit lines, respectively, wherein L and M are natural numbers and L+M equals to K.

According to another aspect, the present invention is directed to a memory cell array block, which includes first memory cells addressed as a first unit logic block, the first memory cells corresponding to at least a portion of $2^K$ (K is a natural number) memory cells of the first unit logic block; and second memory cells addressed as a second unit logic block, the second memory cells corresponding to $2^K$ memory cells of the second unit logic block, wherein the first and second memory cells share in common a peripheral circuit.

According to the example embodiments of the present invention, the size of the memory cell array block may be freely determined.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED EMBODIMENTS OF THE INVENTION

Figure 1:
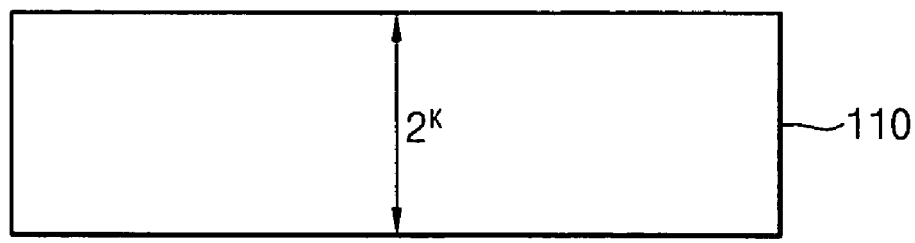
FIG. 1 is a block diagram illustrating a row block of a conventional semiconductor memory device.
Figure 1:
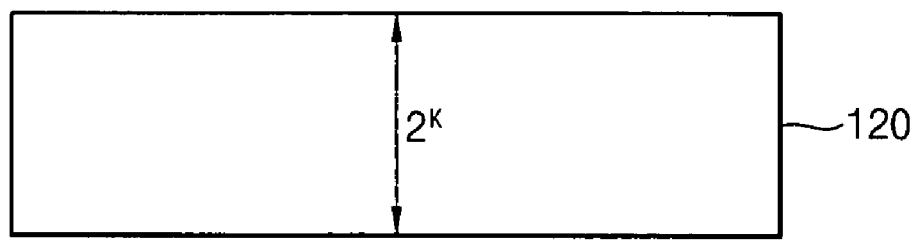
Figure 1:
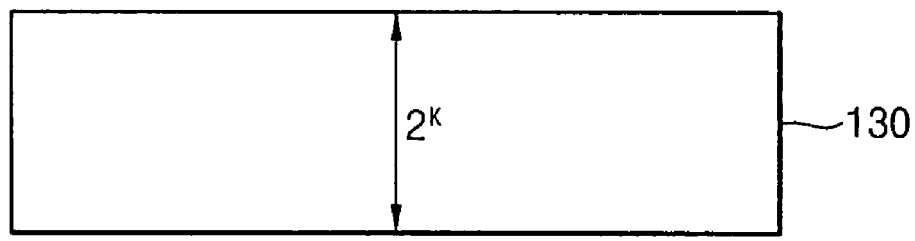
Figure 1:
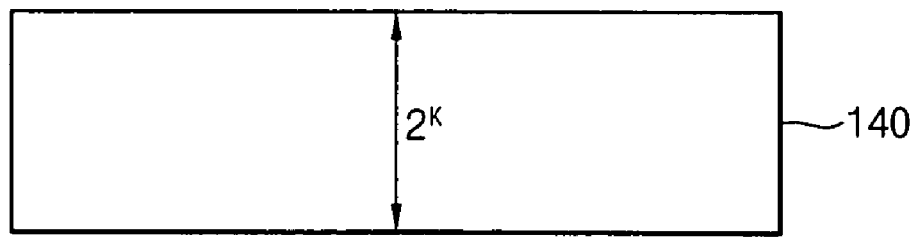
Figure 2A:
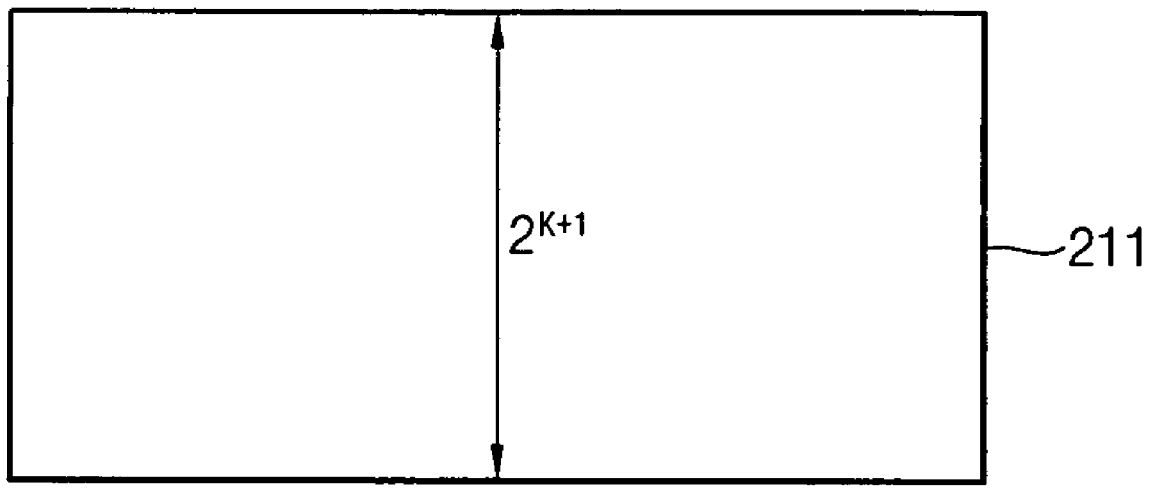
FIGS. 2A and 2B are block diagrams illustrating a conventional method of configuring a memory cell array block.
Figure 2A:
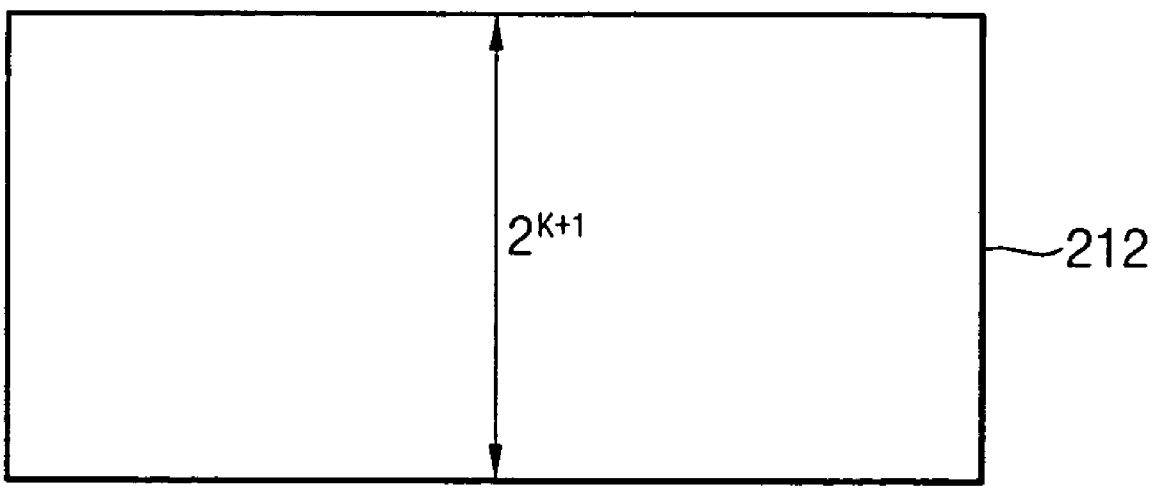
Figure 2B:
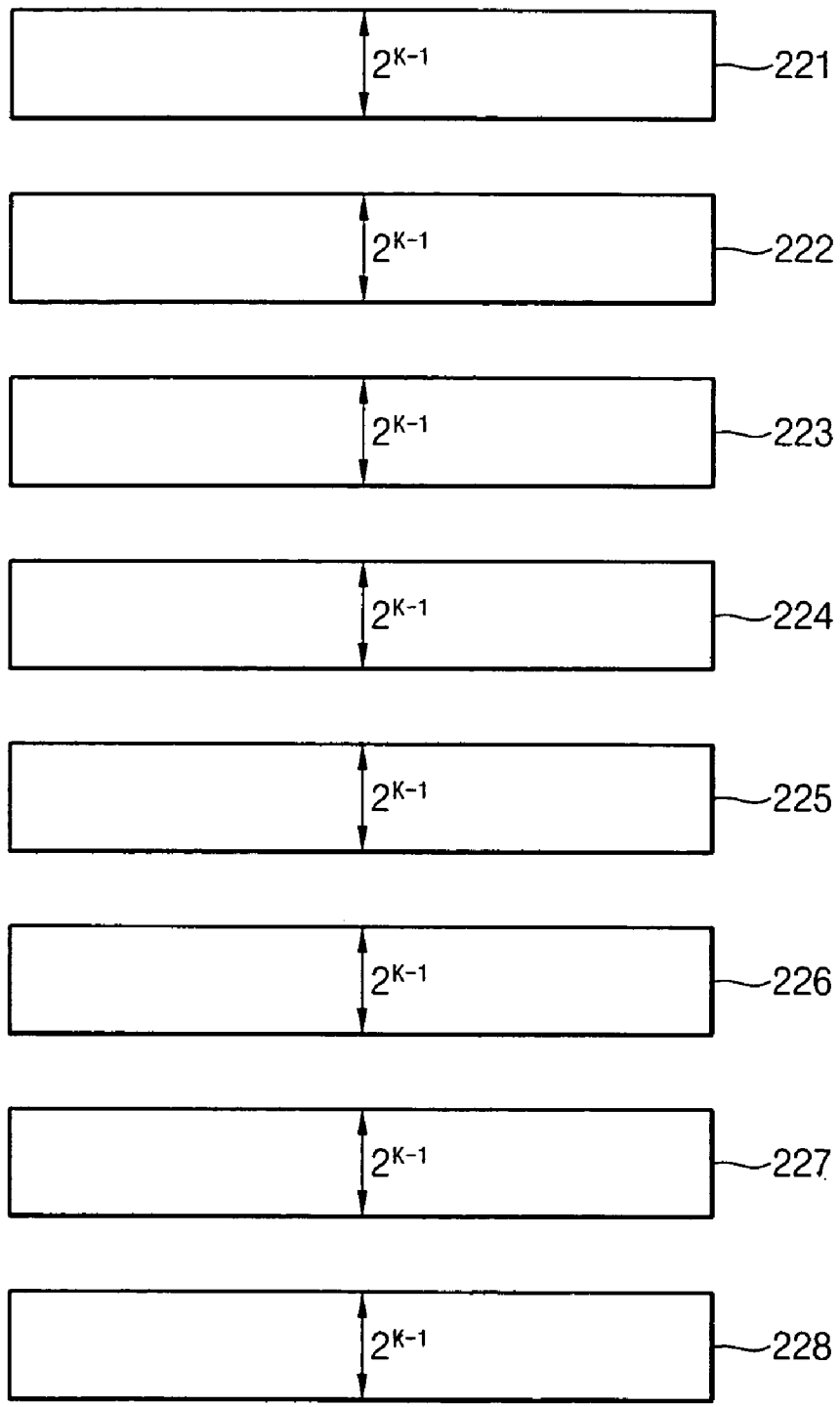
Figure 3:
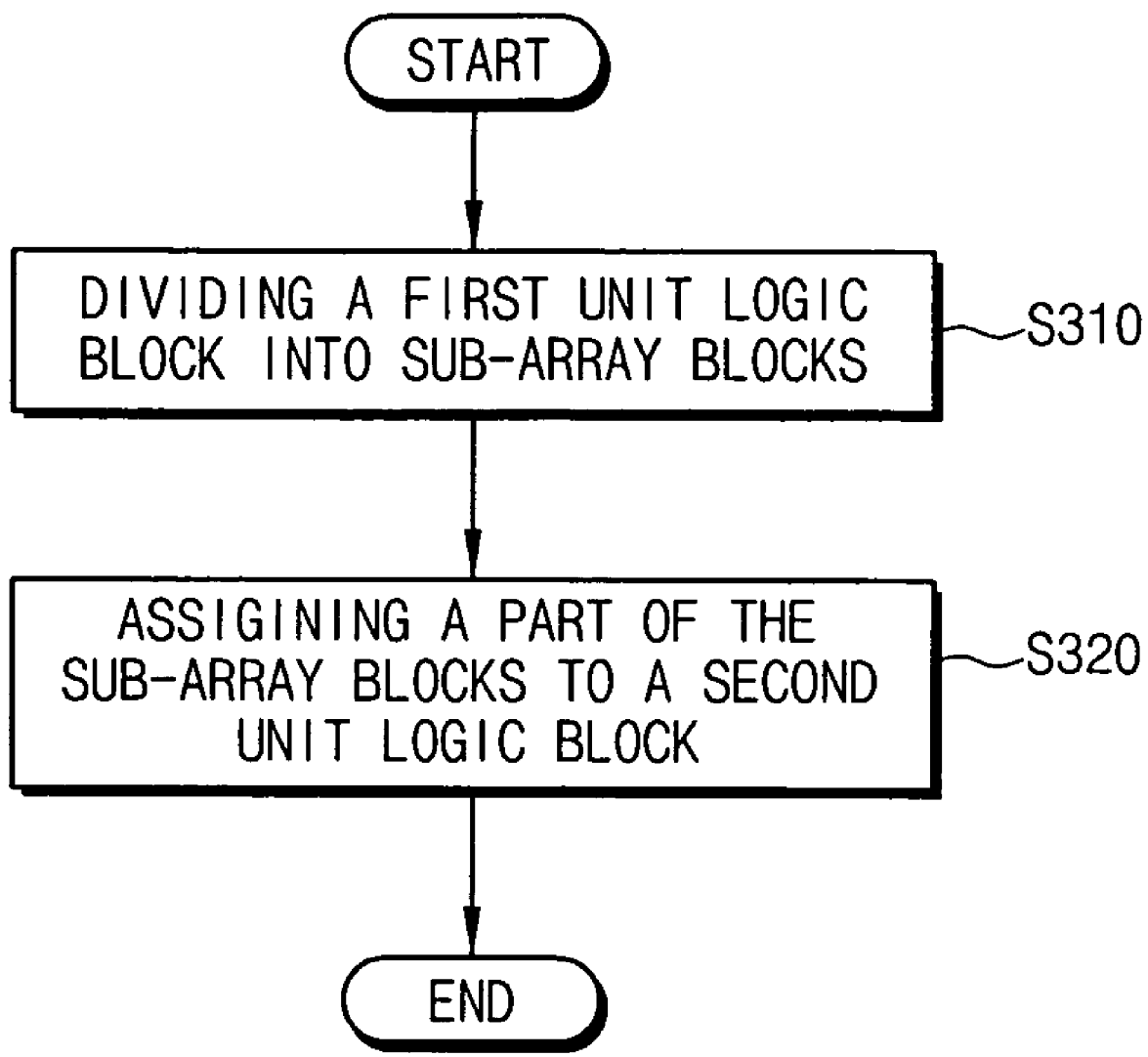
FIG. 3 is a flowchart diagram illustrating a method of configuring a memory cell array block according to an example embodiment of the present invention.

FIG. 3 is a flowchart diagram illustrating a method of configuring a memory cell array block according to an example embodiment of the present invention.

Referring to FIG. 3, a memory cell that is addressed as a first unit logic block is divided to generate sub-array blocks (step S310).

A unit logic block, as a unit of logic, represents a set of memory cells that are addressed as a single block. The first unit logic block may be divided into two or more sub-array blocks.

A portion of the divided sub-array blocks are assigned to a second unit logic block so that memory cells of the assigned part of the sub-array blocks and the second unit logic block may commonly share peripheral circuits (step S320).

The portion of the sub-array blocks divided from the first unit logic block is combined with the second unit logic block to constitute a memory cell array block in a physical structure so that the peripheral circuits are shared by the memory cells of the second unit logic block and the portion of the sub-array blocks of the first unit logic block. The peripheral circuit may include a row decoder for decoding a row address, a column decoder for decoding a column address, a sense amplifier for amplifying a signal read from the memory cell and a bit line equalize/precharge circuit for precharging the bit line, etc.

Figure 4:
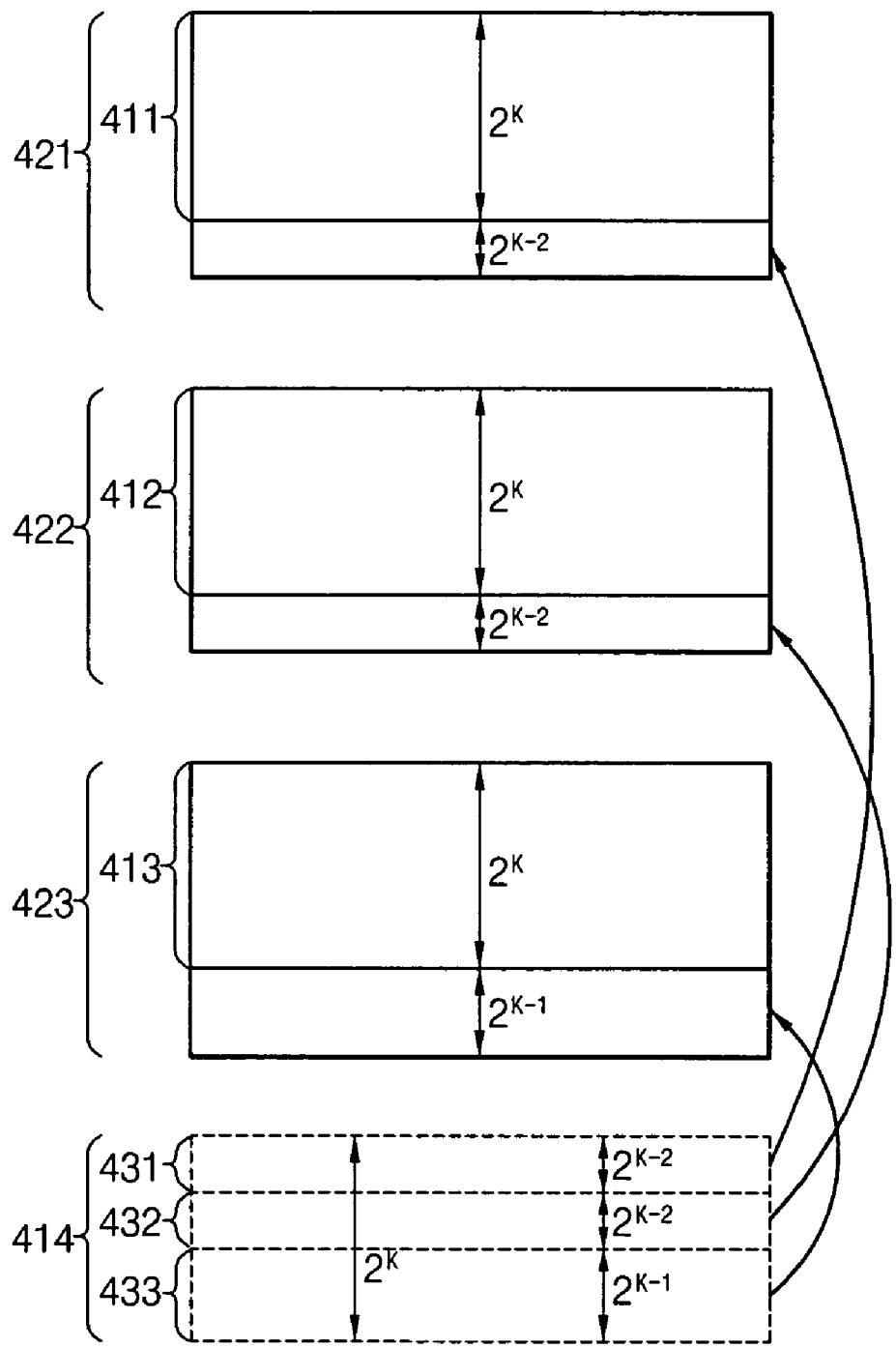
FIGS. 4 through 7 are block diagrams illustrating a method of configuring a memory cell array block according to an example embodiment of the present invention.

FIG. 4 is a block diagram illustrating a method of configuring a memory cell array block according to an example embodiment of the present invention. In FIG. 4, the method of configuring the memory cell array block is described in view of a row arrangement of the memory cell array blocks.

Referring to FIG. 4, the memory cell array includes four unit logic blocks 411, 412, 413, 414 in a logical structure. In a physical structure, the memory cell array includes three memory cell array blocks 421, 422 and 423.

As illustrated in FIG. 4, the unit logic block 414 may be divided into sub-array blocks 431, 432 and 433 that respectively have $2^{K-2}$ word lines, $2^{K-2}$ word lines and $2^{K-1}$ word lines. The sub-array blocks 431, 432 and 433 may be assigned to the unit logic blocks 411, 412 and 413, respectively.

The sub-array block 431 including $2^{K-2}$ word lines is combined with the unit logic block 411 including $2^K$ word lines to form the memory cell array block 421. The sub-array block 432 including $2^{K-2}$ word lines is combined with the unit logic block 412 including $2^K$ word lines to form the memory cell array block 422. The sub-array block 433 including $2^{K-1}$ word lines is combined with the unit logic block 413 including $2^K$ word lines to form the memory cell array block 423.

The memory cell array block 421 includes the unit logic block 411 and the sub-array block 431, the memory cell array block 422 includes the unit logic block 412 and the sub-array block 432, and the memory cell array block 423 includes the unit logic block 413 and the sub-array block 433.

In a physical structure, the unit logic block 414 does not exist as an individual memory cell array block, but is divided into sub-array blocks 431, 432 and 433 that are respectively assigned to other unit logic blocks 411, 412 and 413, to constitute the three memory cell array blocks 421, 422 and 423. The memory cells of each of the memory cell array blocks 421, 422 and 423 may commonly share peripheral circuits such as the row decoder for decoding a row address, the column decoder for decoding a column address, the sense amplifier for amplifying a signal read from the memory cell and the bit line equalize/precharge circuit for precharging the bit line, etc.

In a logical structure, the divided unit logic block 414 is addressed as a separate memory cell array block. Therefore, in addressing the memory cell, the memory cell array operates as if it has four memory cell array blocks, instead of three.

The number of sub-array block divisions in FIG. 4 is given only for illustrative purposes and the unit logic block 414 may be divided into any desired number of the sub-array blocks other than three. In addition, two or more unit logic blocks of the memory cell array may be divided and assigned to other unit logic blocks.

Figure 5:
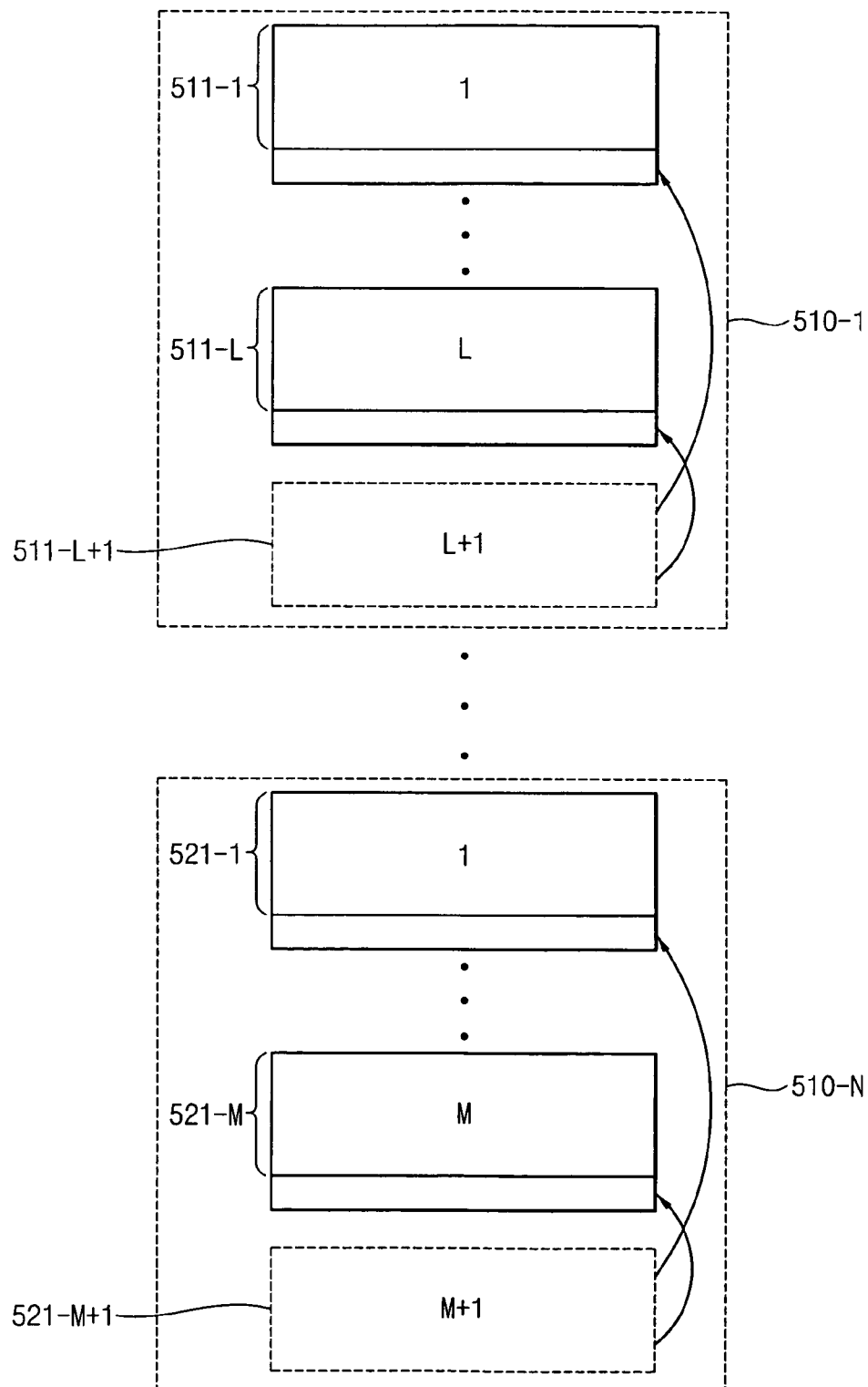

FIG. 5 is a block diagram illustrating a method of configuring a memory cell array block according to another example embodiment of the present invention. In FIG. 5, the method of configuring the memory cell array block is described in view of a row arrangement of the memory cell array blocks.

Referring to FIG. 5, the memory cell array includes N (N is a natural number) logic block groups 510-1, . . . , 510-N. Each of the logic block groups 510-1, . . . , 510-N may include a plurality of unit logic blocks, respectively.

For example, the unit logic block 510-1 may include L+1 unit logic blocks 511-1, . . . , 511-L and 511-L+1.

The unit logic block 511-L+1 may be logically addressed as one block. However, physically, the unit logic block 511-L+1 is divided into L sub-array blocks that are respectively assigned to the other unit logic blocks 511-1, . . . , 511-L. Herein, the unit logic block 511-L+1 may be divided into the sub-array blocks having substantially the same size. Alternatively, the unit logic block 511-L+1 may be divided such that only a part of the sub-array blocks have substantially the same size or all the sub-array blocks have different sizes.

Thus, the unit logic block 511-L+1 is physically divided into the plurality of the sub-array blocks but logically addressed as one unit logic block, so that the other unit logic blocks 511-1, . . . , 511-L to which the divided sub-array blocks are assigned have a desired size.

A logic block group 510-N includes M+1 (M is a natural number) unit logic blocks 521-1, 521-M and 521-M+1. M may have a value different from a value of L. That is, the logic block group 510-N may have a size different from a size of the logic block group 510-1.

The unit logic block 521-M+1 may be logically addressed as an individual block. However, physically, the unit logic block 521-M+1 is divided into M sub-array blocks that are respectively assigned to the other unit logic blocks 521-1, . . . , 521-M. Herein, the unit logic block 521-M+1 may be divided into the sub-array blocks having substantially the same size. Alternatively, the unit logic block 521-M+1 may be divided such that only a part of the sub-array blocks have substantially the same size or all the sub-array blocks have different sizes.

Thus, the unit logic block 521-M+1 is physically divided into the plurality of the sub-array blocks but logically addressed as one unit logic block, so that the other unit logic blocks 521-1, . . . , 521-M to which the divided sub-array blocks are assigned have a desired size.

As described above with reference to FIG. 5, the memory cell array of the semiconductor memory device may be divided into a plurality of logic block groups, and one unit logic block within a logic block group may be divided into a plurality of sub-array blocks that are assigned to other unit logic blocks of the logic block group. Herein, it is not necessary for all of the logic block groups to have the same size. Also, all of the unit logic blocks do not need to be divided into the same number of sub-array blocks.

Figure 6:
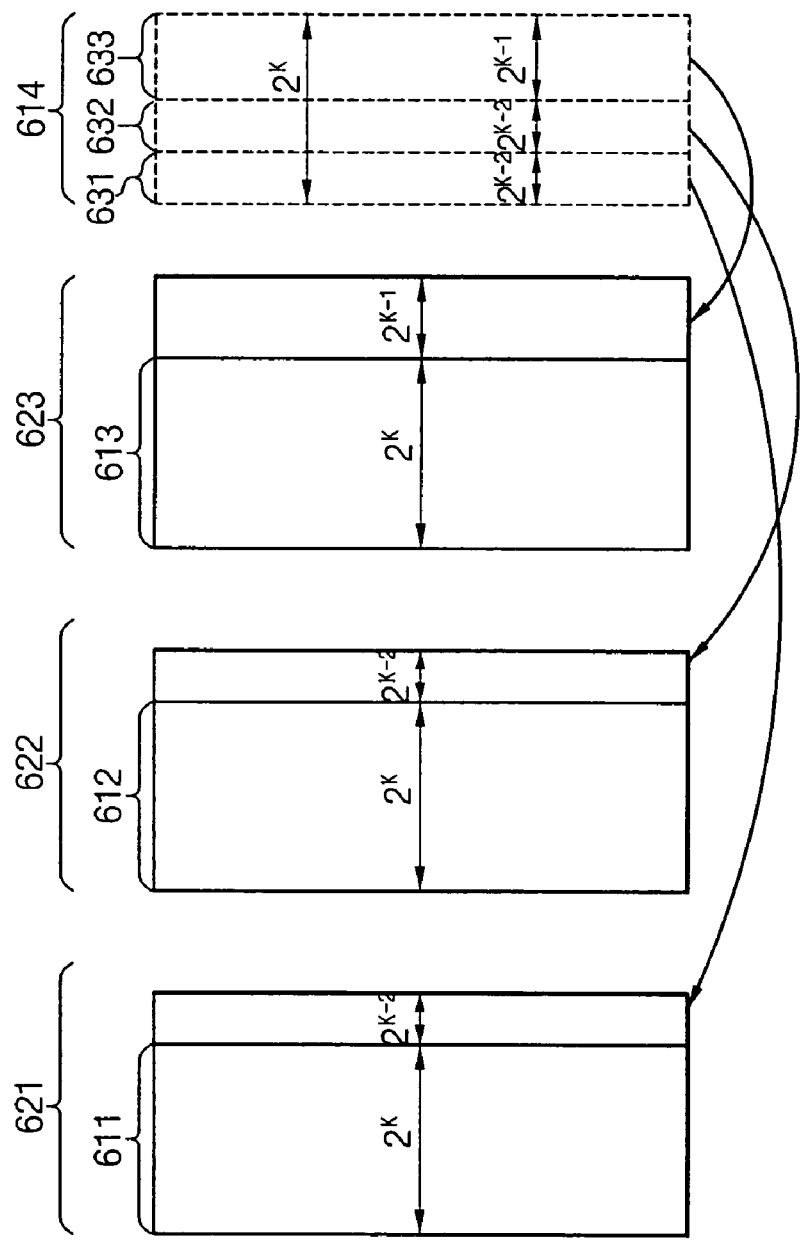

FIG. 6 is a block diagram illustrating a method of configuring a memory cell array block according to still another example embodiment of the present invention. In FIG. 6, the method of configuring the memory cell array block is described in view of a column arrangement of the memory cell array blocks.

Referring to FIG. 6, in a logical structure, the memory cell array includes four unit logic blocks 611, 612, 613, 614. In a physical structure, the memory cell array includes three memory cell array blocks 621, 622 and 623.

As illustrated in FIG. 6, the unit logic block 614 may be divided into sub-array blocks 631, 632 and 633 that have $2^{K-2}$ word lines, $2^{K-2}$ word lines and $2^{K-1}$ word lines, respectively. The sub-array blocks 631, 632 and 633 are assigned to the three unit logic blocks 611, 612 and 613, respectively.

The sub-array block 631 including $2^{K-2}$ word lines is combined with the unit logic block 611 including $2^K$ word lines to form the memory cell array block 621. The sub-array block 632 including $2^{K-2}$ word lines is combined with the unit logic block 612 including $2^K$ word lines to form the memory cell array block 622. The sub-array block 633 including $2^{K-1}$ word lines is combined with the unit logic block 613 including $2^K$ word lines to form the memory cell array block 623.

The memory cell array block 621 includes the unit logic block 611 and the sub-array block 631, the memory cell array block 622 includes the unit logic block 612 and the sub-array block 632, and the memory cell array block 623 includes the unit logic block 613 and the sub-array block 633.

In a physical structure, the unit logic block 614 does not exist as an individual memory cell array block, but is divided into sub-array blocks 631, 632 and 633 that are respectively assigned to other unit logic blocks 611, 612 and 613 to constitute the three memory cell array blocks 621, 622 and 623. The memory cells of each of the memory cell array blocks 621, 622 and 623 may share in common the peripheral circuit such as the row decoder for decoding a row address, the column decoder for decoding a column address, the sense amplifier for amplifying a signal read from the memory cell and the bit line equalize/precharge circuit for precharging the bit line, etc.

In a logical sense, the divided unit logic block 614 is addressed as a separate memory cell array block. Therefore, in addressing the memory cell, the memory cell array operates as if it has four memory cell array blocks, instead of three.

The number of sub-array block divisions in FIG. 6 is given only for illustrative purposes and thus, the unit logic block 614 may be divided into any desired number of the sub-array blocks other than three. In addition, two or more unit logic blocks of the memory cell array may be divided and assigned to other unit logic blocks.

Figure 7:
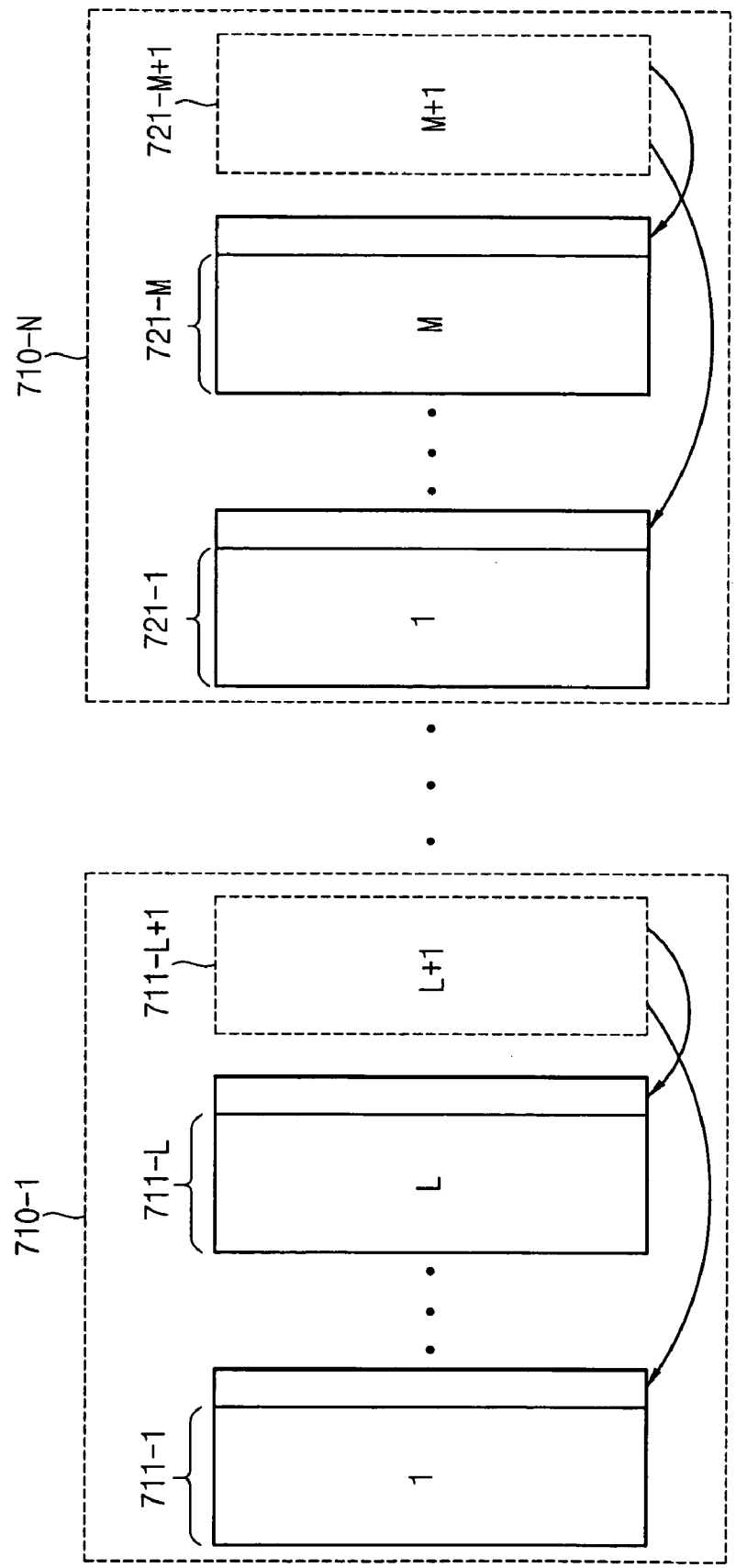

FIG. 7 is a block diagram illustrating a method of configuring a memory cell array block according to still another example embodiment of the present invention. In FIG. 7, the method of configuring the memory cell array block is described in view of a column arrangement of the memory cell array blocks.

Referring to FIG. 7, the memory cell array includes N (N is a natural number) logic block groups 710-1, . . . , 710-N. Each of the logic block groups 710-1, . . . , 710-N may include a plurality of unit logic blocks, respectively.

For example, the unit logic block 710-1 may include L+1 unit logic blocks 711-1, . . . , 711-L and 711-L+1.

The unit logic block 711-L+1 may be logically addressed as one block. However, physically, the unit logic block 711-L+1 is divided into L sub-array blocks that are respectively assigned to the other unit logic blocks 711-1, . . . , 711-L. Herein, the unit logic block 711-L+1 may be divided into sub-array blocks having substantially the same size. Alternatively, the unit logic block 711-L+1 may be divided such that only a part of the sub-array blocks have substantially the same size or all the sub-array blocks have different sizes.

Thus, the unit logic block 711-L+1 is physically divided into the plurality of the sub-array blocks but logically addressed as one unit logic block, so that the other unit logic blocks 711-1, . . . , 711-L to which the divided sub-array blocks are assigned have a desired size.

A logic block group 710-N includes M+1 (M is a natural number) unit logic blocks 721-1, 721-M and 721-M+1. M may have a value different from a value of L. That is, the logic block group 710-N may have a size different from a size of the logic block group 710-1.

The unit logic block 721-M+1 may be logically addressed as one block. However, physically, the unit logic block 721-M+1 is divided into M sub-array blocks that are respectively assigned to the other unit logic blocks 721-1, . . . , 721-M. Herein, the unit logic block 721-M+1 may be divided into sub-array blocks having substantially the same size. Alternatively, the unit logic block 721-M+1 may be divided such that only a part of the sub-array blocks have substantially the same size or all the sub-array blocks have different sizes.

Thus, the unit logic block 721-M+1 is physically divided into the plurality of sub-array blocks but logically addressed as one unit logic block, so that the other unit logic blocks 721-1, . . . , 721-M to which the divided sub-array blocks are assigned have a desired size.

As described above with reference to FIG. 7, the memory cell array of the semiconductor memory device may be divided into a plurality of logic block groups, and one unit logic block within a logic block group may be divided into a plurality of sub-array blocks that are assigned to other unit logic blocks of the logic block group. Herein, it is not necessary for all of the logic block groups to have the same size. Also, all of the logic block groups do not need to be divided into the same number of sub-array blocks.

With reference to FIGS. 4 through 7, the method of configuring the memory cell array block according to various example embodiments of the present invention is described in view of a column block or a row block of the memory cell array. That is, in FIGS. 4 through 7, the memory cell array block is configured based on a unit of a word line or a unit of a bit line. However, it should be understood that the method of configuring the memory cell array block according to an example embodiment of the present invention may also be implemented by configuring the memory cell array based on a unit of a word line and a unit bf a bit line simultaneously.

Figure 8:
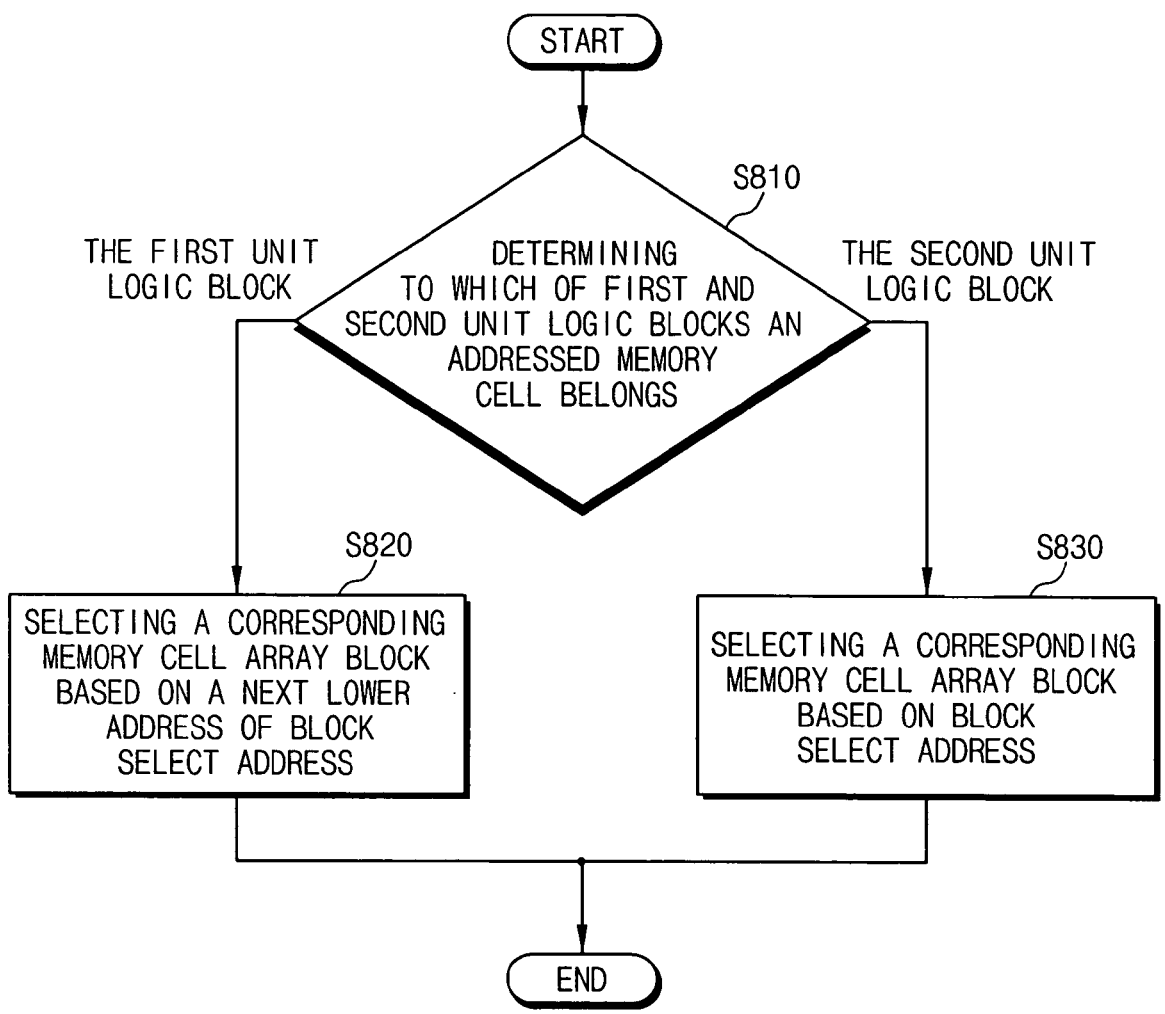
FIG. 8 is a flowchart diagram illustrating a method of addressing a memory cell array block according to an example embodiment of the present invention.

FIG. 8 is a flowchart diagram illustrating a method of addressing a memory cell array block according to an example embodiment of the present invention.

Referring to FIG. 8, when a memory cell array block includes a part of a first unit logic block unit logic block which has $2^K$ (K is a natural number) word lines and a second unit logic block having $2^K$ word lines, wherein the part of the first unit logic block and the second logic block share a common peripheral circuit, it is determined which of the part of the first unit logic block and the second unit logic block an addressed word line belongs based on a block select address (step S810).

That is, whether a word line to be accessed is included in a divided unit logic block (i.e., the first unit logic block) is determined based on the block select address in step S810.

The block select address corresponds to at least one bit of an address signal for selecting one of the unit logic blocks. For example, when the semiconductor memory device has four unit logic blocks in a row of the memory cell array blocks as illustrated in FIG. 4, the block select address may correspond to two bits. In this case, if the block select signal for selecting the unit logic block 414 in FIG. 4 has a bit value of "11", it is determined whether the block select address has the bit value of "11" in step S810.

When it is determined that a word line of the part of the first unit logic block is addressed in step S810, a memory cell array block is selected based on a next lower address of the block select address (step S820). In one embodiment, the block select address may correspond to, for example, upper bits of an address signal. The next lower address of the block select address may correspond to, for example, lower bits of the address signal.

For example, the block select address is determined as "11" in step S810 according to the example embodiment of FIG. 4. In this circumstance, since the selected unit logic block 414 is divided and assigned to other unit logic blocks, it is to be determined which unit logic block the selected unit logic block 414 is assigned to. This may be determined based on the next lower address of the block select address. The bits required to determine which unit logic block the selected unit logic block 414 is assigned to may vary depending on the number of sub-array blocks into which the selected unit logic block 414 is divided.

When it is determined that a word line of the second unit logic block is addressed in step S810, a corresponding memory cell array block is selected based on the block select address (step S830).

For example, the block select address is determined as one of "00", "01" and "10" in step S810 in the example embodiment of FIG. 4. In this circumstance, a memory cell array block including the unit logic block (e.g., 411, 412, 413 in FIG. 4) corresponding to the block select address is selected.

Figure 9:
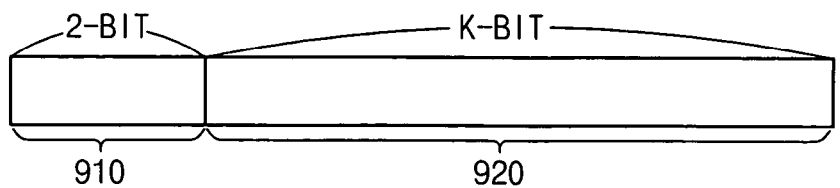
FIG. 9 is a schematic view illustrating a bit configuration of a memory cell array block address according to an example embodiment of the present invention.

FIG. 9 is a schematic view illustrating a bit configuration of a memory cell array block address according to an example embodiment of the present invention.

Referring to FIG. 9, the memory cell array block address according to an example embodiment of the present invention includes a block select address 910 and a next lower address 920 of the block select address 910.

The memory cell array block address in FIG. 9 is described by way of example for the memory cell array block having four unit logic blocks as illustrated in FIG. 4. Accordingly, the block select address 910 has two bits. In addition, each of the unit logic blocks in FIG. 4 has $2^K$ word lines so that the next lower address 920 of the block select address K bits.

TABLE 1

| Address | | |
|---|---|---|
| Block Select Address (2-bit) | Lower Address (K-bit) | The Selected Memory Cell Array Block in FIG. 4 |
| 00 | . . . | 421 |
| 01 | . . . | 422 |
| 10 | . . . | 423 |
| 11 | 00 . . . | 421 (431) |
|  | 01 . . . | 422 (432) |
|  | 1 . . . | 423 (433) |

Table 1 shows a method of addressing the memory cell array block according to an example embodiment of the present invention. Particularly, Table 1 shows the addressing of the memory cell array block in the embodiment of FIG. 4. Table 1 shows the addressing of the memory cell array block when the memory cell array includes four unit logic blocks 411, 412, 413, 414, and the unit logic block 414 is divided into three array blocks 431, 432 and 433 that are assigned to other unit logic blocks 411, 412 and 413, respectively. Therefore, in a physical structure, the memory cell array includes three memory cell array blocks 421, 422 and 423.

Referring to Table 1, when the unit logic block 414 that is divided into sub-array blocks is not selected by the block select address, the memory cell array block corresponding to two bits of the block select address is selected. For example, the memory cell array block 421 in FIG. 4 is selected corresponding to a binary value "00" of the block select address, the memory cell array block 422 in FIG. 4 is selected corresponding to a binary value "01" of the block select address, and the memory cell array block 423 in FIG. 4 is selected corresponding to a binary value "10" of the block select address.

When the unit logic block 414 that is divided into sub-array blocks is selected by the block select address (i.e., the block select address has a binary value "11"), the memory cell array block is selected based on the next lower address of the block select address. In Table 1, a most significant bit (MSB) and a second most significant bit (MSB-1) of the lower address is used to select the memory cell array block.

When the most significant bit (MSB) of the block select address is "1", the memory cell array block 423 in FIG. 4 is selected. This is because when the MSB of the lower address is "1", a word line of the sub-array block 433 merged into the memory cell array block 423 is accessed.

When the most significant bit (MSB) and a second most significant bit (MSB-1) of the block select address is "01", the memory cell array block 422 in FIG. 4 is selected. This is because when the MSB and MSB-1 of the lower address is "01", a word line of the sub-array block 432 merged into the memory cell array block 422 is accessed.

When the most significant bit (MSB) and the second most significant bit (MSB-1) of the block select address correspond to "00", the memory cell array block 421 in FIG. 4 is selected. This is because when the MSB and MSB-1 of the lower address is "00", a word line of the sub-array block 431 merged into the memory cell array block 421 is accessed.

The method of assigning the memory cell array block is described with reference to FIGS. 8 and 9 and Table 1. Although above example embodiments discuss the method of addressing the memory cell array in a row, example embodiments of the present invention may also be applied to addressing the memory cell array in a column. In addition, the block select address may have more than two bits and the number of the unit logic blocks may be determined as corresponding to the bit number of the block select signal.

Figure 10:
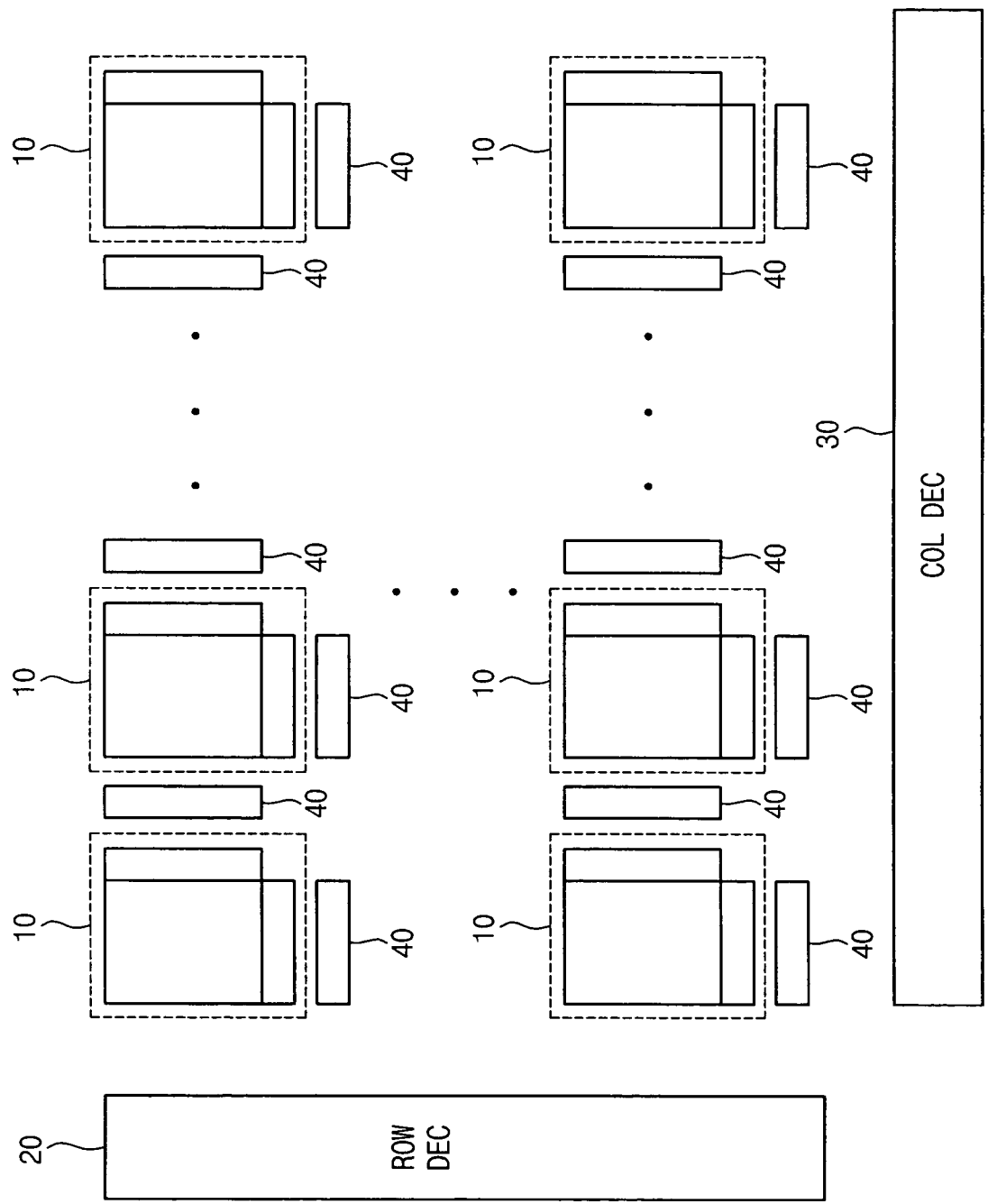
FIG. 10 is a block diagram illustrating a semiconductor memory device according to an example embodiment of the present invention.

FIG. 10 is a block diagram illustrating a semiconductor memory device according to an example embodiment of the present invention.

Referring to FIG. 10, the semiconductor memory device according to an example embodiment of the present invention includes memory cell array blocks 10, a row decoder 20, a column decoder 30 and peripheral circuits 40. It is illustrated that the row decoder 20 and the column decoder 30 are distinct from the peripheral circuits 40. However, the row decoder 20 and the column decoder 30 may be included in the peripheral circuits 40.

The memory cell array block 10 may include a unit logic block. In addition, the memory cell array block 10 may include a combined memory cell array block where the unit logic block is combined with the sub-array block of another unit logic block. The combined memory cell array block may correspond to the memory cell array block illustrated in FIGS. 4 through 7 (for example, 421, 422 and 423 in FIG. 4).

By assigning and addressing the memory cell array block according to an example embodiment of the present invention, the size of the memory cell array block may be variably adjusted.

The row decoder 20 decodes a row address of the memory cell array block and the column decoder 30 decodes a column address of the memory cell array block.

Although the semiconductor memory device in FIG. 10 includes one row decoder and one column decoder, two or more row decoders and two or more column decoders may be used.

The peripheral circuit 40 may include typical peripheral circuits that are used by the memory cell array block. For example, the peripheral circuit 40 may include a bit line sense amplifier for amplifying a bit line signal, an input and output (I/O) sense amplifier for amplifying a signal on an input and output line and a bit line equalize/precharge circuit for precharging the bit line, etc. Further, as mentioned above, the peripheral circuit 40 may include the row decoder 20 and the column decoder 30.

According to an example embodiment of the present invention, the semiconductor memory device may assign memory cell array blocks of a desired size by organizing the memory cell array block into logical and physical structures that differ from each other. That is, in a logical structure, the memory cell array block may be addressed as a power of two unit logic blocks to achieve the convenience of addressing the memory cell array block, and in a physical structure, each of the unit logic blocks may be divided into several unit logic blocks and assigned to other unit logic blocks to freely adjust the size of the memory cell array block. Therefore, the semiconductor memory device may have a desired transmission characteristic and a chip size.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of configuring a memory cell array block, comprising:
    dividing a first unit logic block comprising first memory cells into sub-array blocks; and
    assigning at least a portion of the sub-array blocks to a second unit logic block comprising second memory cells, wherein the memory cell array block includes the portion of the sub-array blocks and the second unit logic block, and the portion of the sub-array blocks and the second unit logic block share a peripheral circuit.

2. The method of claim 1, wherein each of the first unit logic block and the second unit logic block comprises $2^K$ word lines and $2^L$ bit lines where K and L are natural numbers.

3. The method of claim 2, wherein the first unit logic block is divided into the sub-array blocks based on a unit of a word line or a unit of a bit line.

4. The method of claim 2, wherein the peripheral circuit comprises a row decoder configured to decode a row address.

5. The method of claim 2, wherein the peripheral circuit comprises:
    a column decoder configured to decode a column address;
    a sense amplifier configured to amplify a signal read from a memory cell; and
    an equalize/precharge circuit configured to precharge a bit line.

6. A method of addressing a plurality of memory cell array blocks, the memory cell array blocks comprising at least a portion of a first unit logic block having $2^K$ word lines and a second unit logic block having $2^K$ word lines where K is a natural number, the portion of the first unit logic block and the second unit logic block sharing a peripheral circuit, the method comprising:
    determining to which of the first unit logic block and the second unit logic block an addressed word line belongs based on a block select address;
    selecting a corresponding memory cell array block based on the block select address when the addressed word line belongs to the second unit logic block; and
    selecting a corresponding memory cell array block based on a next lower address of the block select address when the addressed word line belongs to the first unit logic block.

7. The method of claim 6, wherein the peripheral circuit comprises:
    a column decoder configured to decode a column address;
    a sense amplifier configured to amplify a signal read from a memory cell; and
    an equalize/precharge circuit configured to precharge a bit line.

8. The method of claim 7, wherein the peripheral circuit comprises a row decoder configured to decode a row address.

9. A method of addressing a plurality of memory cell array blocks, the memory cell array blocks comprising at least a portion of a first unit logic block having $_2K$ bit lines and a second unit logic block having $_2K$ bit lines where K is a natural number, the portion of the first unit logic block and the second unit logic block sharing a peripheral circuit, the method comprising:
    determining to which of the first unit logic block and the second unit logic block an addressed bit line belongs based on a block select address;
    selecting a corresponding memory cell array block based on the block select address when an addressed bit line belongs to the second unit logic block; and
    selecting a corresponding memory cell array block based on a next lower address of the block select address when the addressed bit line belongs to the first unit logic block.

10. The method of claim 9, wherein the peripheral circuit comprises:
    a column decoder configured to decode a column address;
    a sense amplifier configured to amplify a signal read from a memory cell; and
    an equalize/precharge circuit configured to precharge a bit line.

11. The method of claim 10, wherein the peripheral circuit comprises a row decoder configured to decode a row address.

12. A semiconductor memory device, comprising:
    memory cell array blocks; and
    peripheral circuits respectively corresponding to the memory cell array blocks,
    wherein each of the memory cell array blocks includes at least one combined memory cell array block; and
    wherein the combined memory cell array block includes:
        first memory cells addressed as a first unit logic block, the first memory cells corresponding to at least a portion of $2^K$ memory cells of the first unit logic block where K is a natural number; and
        second memory cells addressed as a second unit logic block, the second memory cells corresponding to $2^K$ memory cells of the second unit logic block.

13. The semiconductor memory device of claim 12, wherein the first unit logic block and the second unit logic block respectively include $2^L$ word lines and $2^M$ bit lines where L and M are natural numbers and L+M corresponds to K.

14. The semiconductor memory device of claim 13, wherein the peripheral circuit comprises a row decoder configured to decode a row address.

15. The semiconductor memory device of claim 13, wherein the peripheral circuit comprises:
    a column decoder configured to decode a column address;

a sense amplifier configured to amplify a signal read from a memory cell; and an equalize/precharge circuit configured to precharge a bit line.

16. A memory cell array block, comprising:

first memory cells addressed as a first unit logic block, the first memory cells corresponding to at least a portion of $2^K$ memory cells of the first unit logic block where K is a natural number; and second memory cells addressed as a second unit logic block, the second memory cells corresponding to $2^k$ memory cells of the second unit logic block, wherein the first memory cells and the second memory cells share a peripheral circuit.

17. The memory cell array block of claim 16, wherein the peripheral circuit comprises a row decoder configured to decode a row address.

18. The memory cell array block of claim 16, wherein the peripheral circuit comprises a column decoder configured to decode a column address.

19. The memory cell array block of claim 16, wherein the peripheral circuit comprises:

a sense amplifier configured to amplify a signal read from a memory cell; and an equalize/precharge circuit configured to precharge a bit line.

* * * * *

UNITED STATES PATENT AND TRADEMARK OFFICE
CERTIFICATE OF CORRECTION

| | |
|---|---|
| PATENT NO. | : 7,227,807 B2 |
| APPLICATION NO. | : 11/302606 |
| DATED | : June 5, 2007 |
| INVENTOR(S) | : Sang-Pyo Hong et al. |

It is certified that error appears in the above-identified patent and that said Letters Patent is hereby corrected as shown below:

Column 12, line 17 claim 9 delete "$_2K$" and insert --$2^K$--

Column 12, line 18 claim 9 delete "$_2K$" and insert --$2^K$--

Signed and Sealed this

Twenty-ninth Day of July, 2008

JON W. DUDAS
*Director of the United States Patent and Trademark Office*